United States Patent [19]

Eisfeller

[11] Patent Number: 5,198,272

[45] Date of Patent: Mar. 30, 1993

[54] THERMAL EVAPORATION IN TWO PLANES

[75] Inventor: Richard C. Eisfeller, Greenland, N.H.

[73] Assignee: Davidson Textron Inc., Dover, N.H.

[21] Appl. No.: 856,713

[22] Filed: Mar. 24, 1992

[51] Int. Cl.[5] .................................................. C23C 14/24
[52] U.S. Cl. ............................. 427/251; 427/255.5; 118/726; 118/730
[58] Field of Search ................ 118/726, 730; 427/251, 427/255.5

[56] References Cited

U.S. PATENT DOCUMENTS

| | | | |
|---|---|---|---|
| 4,116,161 | 9/1978 | Steube | 118/730 |
| 4,431,711 | 2/1984 | Eisfeller | 428/31 |
| 4,584,965 | 4/1986 | Ogisu | 118/730 |
| 4,668,479 | 5/1987 | Manabe | 118/730 |
| 5,079,854 | 1/1992 | Hammond | 118/730 |
| 5,133,604 | 7/1992 | Eisfeller | 374/54 |

Primary Examiner—Richard Bueker
Attorney, Agent, or Firm—Reising, Ethington, Barnard, Perry & Milton

[57] ABSTRACT

Vacuum metallizing substrates having both vertical and horizontal surfaces occurs by directing metal from two remote sources by thermal evaporation. One source is connected horizontally below the object to depose metal vertically toward the object to the horizontal surface thereof. The second source is connected vertically to the object to depose metal horizontally toward the object to the vertical surface thereof. A vacuum chamber contains a rotating carousel supporting the objects with the sources located fixedly within the chamber to perform the thermal evaporation.

5 Claims, 2 Drawing Sheets

THERMAL EVAPORATION IN TWO PLANES

TECHNICAL FIELD

The invention relates to vacuum metallizing plastic and similar dielectric substrates wherein a corrosion prone metal is vacuum deposited on the substrate by thermal evaporation.

BACKGROUND OF THE INVENTION

Vacuum metallizing of plastic and similar dielectric substance has been practiced for some time. The automobile industry has used metallized trim components that can be substituted for conventional chrome-plated metal parts. The stages of metal film growth by vacuum deposition proceeds from metal nucleation and nuclei growth, liquid coalescence to electrically discrete islands, channelization with incipient film conductivity, and finally fully continuous film formation.

U.S. Pat. No. 4,431,711, issued Feb. 14, 1984 in the name of Eisfeller, assigned to the assignee of the subject invention, discloses one method of vacuum metallizing dielectric substrates with indium and alloys thereof. The patent relates to an article of manufacture comprising organic dielectric bases or substrates having a smooth surface, such as a molded plastic. A macroscopically continuous-appearing very thin layer thereon of indium and alloys thereof, is deposited on the smooth surface. The metal is in the form of minute specular electrically discrete rounded metal islands. There is a top coating over the metal film of an intimately adhered dielectric resin film encapsulating and protecting the metal particles, and binding them firmly to the substrate. The product is particularly useful in automotive applications, such as an automobile exterior trim components to replace heavier and more expensive conventional chrome-plated metal parts.

During the vacuum metallizing process, a vacuum chamber encompasses the dielectric substrate to be coated along with evaporator boats having deposited metal material thereon, which material is evaporated or vaporized onto the substrate. Due to the unique operating characteristics of the vacuum metallizing process, it has been determined that matched evaporation boats, i.e., having similar evaporation rate or heating rates, provides for better part quality and better first run capability. Such is disclosed in U.S. patent application Ser. No. 737,686, filed Jul. 30, 1991, and assigned to the same assignee of the subject invention, now U.S. 5,133,604.

In general, a plurality of evaporation boats are mounted on a horizontal bus bar and connected in parallel or series to a power source during thermal evaporation of the metal material. The evaporation boats are connected horizontally below a rotational carousel which supports the objects to be metallized. The carousel includes a plurality of reels thereon which support the object to be metallized and which may rotate independently of the carousel rotation. The carousel rotates during the evaporation process in order to obtain even adherence of the metal to each object thereon. A problem with this type of system is that indium is generally evaporated only in the vertical direction to mainly horizontal surfaces of the object. Any curved or vertical standing surfaces of the object generally do not receive a coat of the indium, or at least an even coat with relation to the remainder of the object.

SUMMARY OF THE INVENTION

The invention is a metallizing apparatus and process for vacuum metallizing an object having a horizontal surface and a vertical surface. The assembly includes rotatable means having a horizontal axis therethrough and adapted for rotatably supporting an object to be metallized for rotation about the horizontal axis. The assembly also includes first evaporation means connected horizontally below the rotatable means for containing and evaporating metal particles vertically toward the object to the horizontal surface. The assembly is characterized by including a second evaporation means, or bus bar, mounted vertically for containing and evaporating metal particles parallel with the horizontal axis and toward the object to the vertical surface thereof.

FIGURES IN THE DRAWINGS

Other advantages of the present invention will be readily appreciated as the same becomes better understood by reference to the following detailed description when considered in connection with the accompanying drawings wherein.

DESCRIPTION OF THE PREFERRED EMBODIMENT

Figure 1:
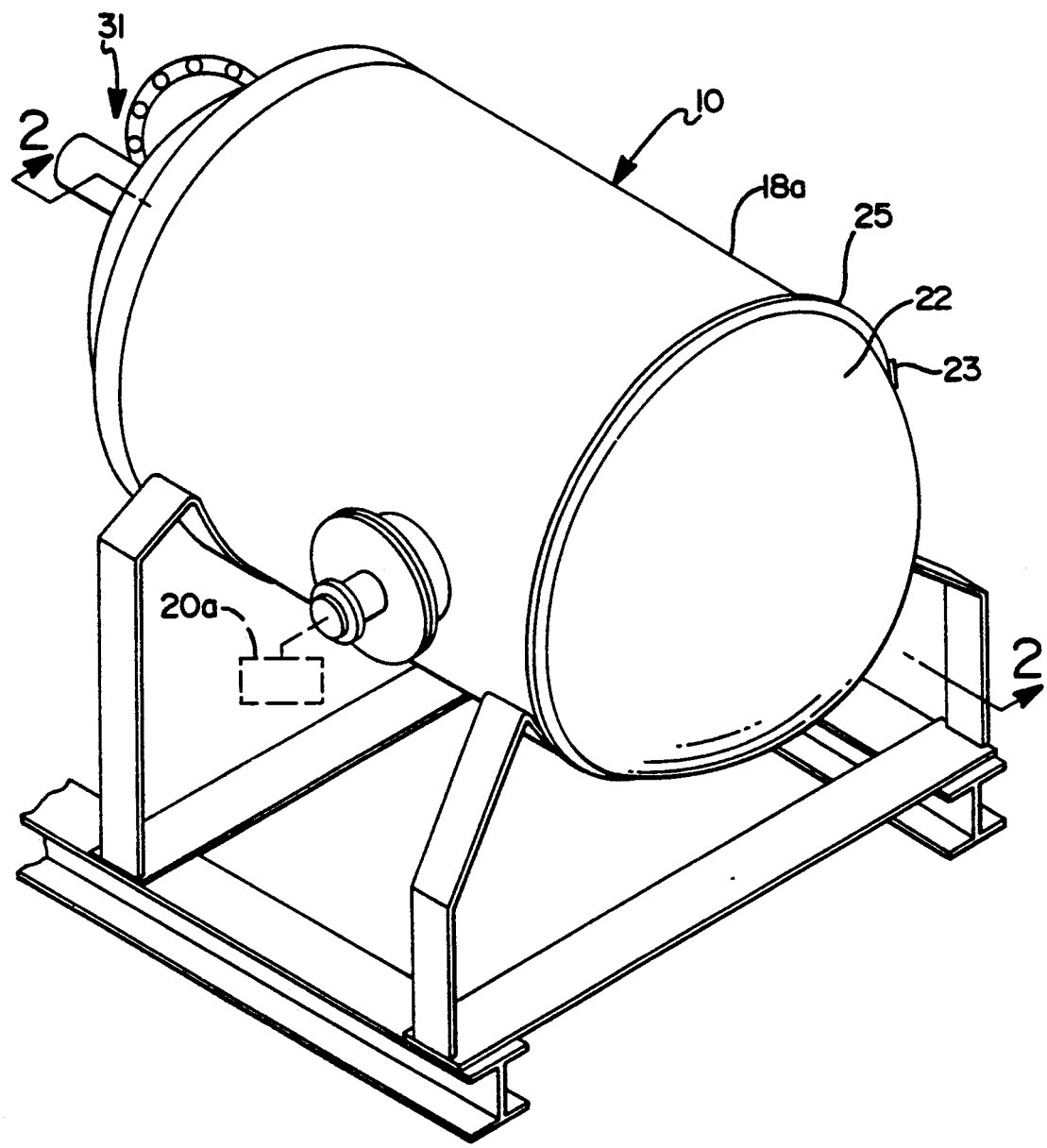
FIG. 1 is a perspective view of the apparatus of the subject invention.
Figure 2:
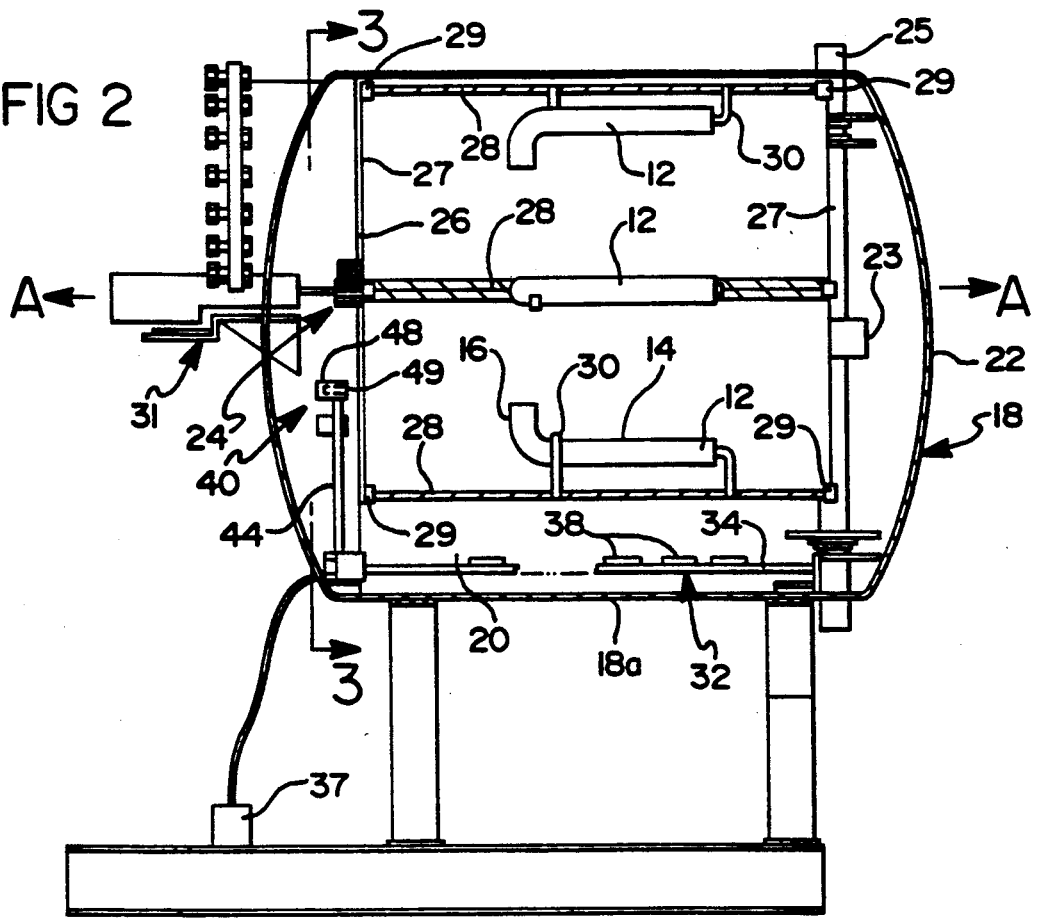
FIG. 2 is a cross sectional view taken along lines 2—2 of FIG. 1.
Figure 3:
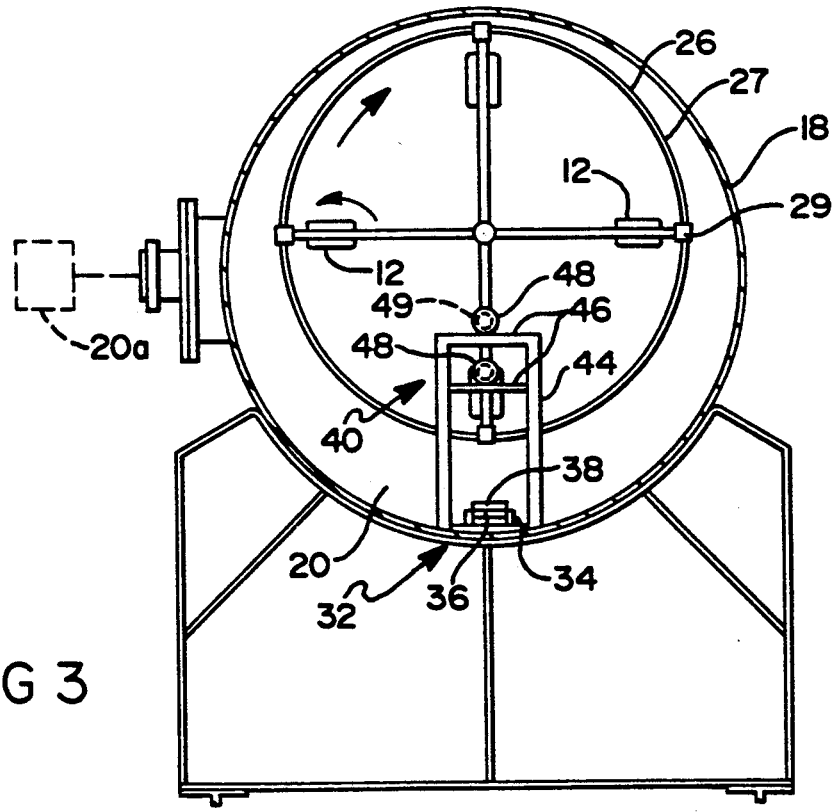
FIG. 3 is a cross-sectional view taken along lines 3—3 of FIG. 2.

A metallizing apparatus for vacuum metallizing an object 12 is generally illustrated at 10 in FIGS. 1 and 2. The object or substrate 12 to be metallized is of the type which includes a horizontal surface 14 and a vertical surface 16. The product formed may be an automobile exterior trim component, such as a bumper for a vehicle which is generally of an L-shaped configuration. It is to be understood that other types of objects and materials may be vacuum metallized and formed which are within the scope of the invention.

The object 12 comprises an organic dielectric base or substrate having a smooth surface such as molded plastic. The metallized object 12 or product is particularly useful in the automotive application as an automobile exterior trim component to replace heavier and more expensive conventional chrome-plated metal parts. The substrate may be as the types set forth in U.S. Pat. No. 4,431,771 discussed in the Background of the Invention and incorporated by reference herein.

Any suitable dielectric, i.e., insulating material, can be used to receive the vacuum deposited metal such as dry wood, glass or plastic. For the intended automobile trim component application, a castable or moldable plastic is used, preferably an elastomer that is tough and abuse resistant with some flexibility such as an injection molding grade thermal plastic polyurethane. Other suitable substrate materials are set forth in the referenced '711 patent.

The apparatus 10 is utilized to deposit or collect a thin vacuum metallized layer of indium into electrically discrete islands, wherein the metal layer is corrosion resistant when adequately top coated, though the indium is a metal that is specially corrosion prone. The indium film is conductive as deposited because metal nuclei initially deposited from the vapor phase are allowed to grow in molten phase only to a discrete island stage with the particles being electrically isolated from one another. The coating is kept quite thin and there is insufficient metal deposited to bring about coalescence of the metal particles and formation of an electrically conductive film. The indium layer generally has a nominal thickness less than 1000Å A, preferably less than 600Å A. By "nominal thickness" it is meant the thickness determined by the weight of metal deposited per unit area as if a continuous film.

The metal film must be thick enough to reflect sufficient light to make the coated article 12 appear as a metal article, as set forth in the referenced patent. As discussed therein, a resinous top coat is applied over the metal indium to improve resistance to mechanical abuse. Clear moisture resistant acrylic, urethane, and the like coating applied as a latex and more preferably as a solvent solution are suitable.

The above deposition of indium film may be carried out by a variety of methods. The subject invention relates to vacuum deposition through thermal evaporation of the indium carried out at a vacuum of $5 \times 10^3$ Torr or less. The apparatus of performing such vacuum deposition as illustrated and in the referenced patent may be of the type used by Davidson Technology Center, a unit of Davidson Textron Inc., identified as a custom 48 inch metallizer manufactured by K.H. Frederick Co.

The apparatus 10 of the subject invention utilizes the prior art metallizer, though modified as subsequently discussed. The subject invention allows all vertical 16 and horizontal 14 surfaces to be metallized. The apparatus 10 includes a housing 18 forming a vacuum chamber 20 therein and having a door 22 hinged on hinge 23 for allowing access to the chamber 20 and sealable when closed at a joint 25 between the door 22 and the housing cylinder 18a. Within the chamber 20 is located rotatable means 24 having a horizontal axis A therethrough and adapted to rotatably support the object 12 for metallizing.

The rotatable means 24 generally includes a rotatable carousel 26 with the axis A substantially at the center thereof. The rotatable carousel 26 includes a pair of circular end supports 27 with a plurality of support bars or reels 28 extending between the end supports 27 along the outer diameter thereof and parallel with the horizontal axis A. The support bars or reels 28 are rotatably secured to the end supports 27, by bearings 29 or the like. A plurality of hangers 30 are fixedly attached to the support bars 28 for supporting the object 12 thereto. The hangers 30 utilized to secure the object 12 to the reel 28 may include clips or fasteners to hold the object 12 thereto as commonly known in the art. The object 12 is mounted on the reel 28 so as to maintain the horizontal and vertical surfaces of the object 12 accordingly horizontal and vertical, respectively, to the axis. Drive means 31 is connected to the rotatable carousel 26 and optionally to the reels 28 for causing rotation of the carousel 26 during vaporization. The carousel 26 rotates causing rotation of the reels 28 in response thereto. In some applications, it is also desirable to cause independent rotation of the reels 28 along with the rotation of the carousel 26.

The assembly includes first evaporation means 32 connected horizontally below the carousel 26 for containing and evaporating metal particles vertically toward the object 12 substantially to the horizontal surfaces 14. The first evaporation means 32 comprises a bus bar 34 longitudinally extending below the carousel 26 and parallel with the horizontal axis for receiving and transmitting a voltage. The bus bar 34 generally comprises two parallel members 34 with cross bars 36 therebetween. A plurality of elongated bowl shaped, metal boats 38 are connected across the cross bars 36 and to the bus bar 34. The boats 38 contain the metal to be evaporated, such as indium. The boats 38 are generally comprised of a tungsten material and may be of the type set forth in the referenced patent application Ser. No. 737,686. The bus bar 34 receives a voltage from a transformer 37 or the like, for a predetermined time which causes the evaporation of the metal particles and line of sight deposition of the metal particles onto the object 12 in the vacuum chamber 20 during periods when it is evacuated by a vacuum pump system 20a. This basic system herein before described is commonly known in the art and is of the type previously cited.

The following description includes the modification and novel adaption. The apparatus 10 is characterized by including second evaporation means 40 mounted vertically for containing and evaporating metal particles horizontally toward the object 12 and to the vertical surfaces 16 thereof. The second evaporation means 40 also comprises a bus bar having two parallel conductive arms 44 extending vertically toward the central axis A of the carousel 26. A conductive center cross bar 46 interconnects the parallel arms 44. The center cross bar 46 connects to a tubular evaporation boat 48 which contains metal to be vaporized, such as indium. The tubular boat 48 is generally tubular in shape with one open end 49 which is directed toward the end of the carousel 26 and towards the vertical surface 16 of the object 12. The boat 18 is electrically connected to the bus bar 44. The tubular boat 48 is slightly inclined, i.e., 5 degrees upwardly at open end 49, to insure that the metallizing indium does not flow out prior to the vacuum metallizing process. In response to energization of the bus bar 44 to a predetermined voltage level, the metal within the boat 48 will vaporize and will be horizontally received on the object at the vertical surfaces 16 thereof when the chamber 20 is evacuated.

In either the first or second evaporation means 32, 40, any number of boats 38, 48 may be utilized. In the first evaporation means 32, a plurality of boats 38 are electrically connected in series or series parallel horizontally below the carousel 26 extending less than the length of the reels 28. With regard to the second evaporation means 40, the number of tubular boats 48 generally depends on the length of the vertical surface 16 of object 12 and can vary from one to six boats.

Also included is a method of vacuum metallizing an object 12 having a horizontal surface 14 and a vertical surface 16. The method includes steps of rotating the object 12 to be metallized about a horizontal axis, vacuum metallizing in a horizontal direction toward the vertical surface 16, and vacuum metallizing in a vertical direction toward the horizontal surface 14 to deposit metal thereon. Thereafter, a top coat is applied to the metallized object 12 for additional corrosion protection.

As an example of the above application, an injection molded bumper of thermal plastic urethane is molded into a generally L-shaped configuration. A urethane enamel base coat is applied over the bumper. After the bumper is cooled, it is vacuum metallized using the previously identified metallizer. The pumping system for the apparatus 10 consists of a mechanical roughing pump, a silicone oil diffusion pump, and a liquid nitrogen cold trap to minimize water vapor and outgassing in the chamber 20. 1.0 grams of high purity indium is evaporated from eight 5 mil thick tungsten boats 38 connected in series to a 20 volt ac variable transformer. The four tubular tungsten boats 48 are connected in parallel to a 5 volt ac variable transformer and contain 0.3 grams. Eight boats 38 are located horizontally below and parallel with the carousel 28 or horizontal axis A. Power of 2.1 volts and 225 amperes was applied to the horizontal bus bar 34 for 2 minutes from a suitable low voltage power supply. Four tubular boats 48 were utilized and two each are placed and aligned at the end of each reel 28. Power supplied was 2.8 volts and 63 amperes for 2 minutes. The bumper 12 is rotated on the carousel at 20 rpm with source to substrate distance varying during rotation from $8\frac{1}{2}$ inches to $14\frac{1}{2}$ inches. This gives the metal thickness on the part of 350Å. Thereafter, a top coat is applied as discussed in the referenced patent.

The invention has been described in an illustrative manner, and it is to be understood that the terminology which has been used is intended to be in the nature of words of description rather than of limitation.

Obviously, many modifications and variations of the present invention are possible in light of the above teachings. It is, therefore, to be understood that within the scope of the appended claims the invention may be practiced otherwise than as specifically described.

What is claimed is:

1. A metallizing apparatus for vacuum metallizing an object having a horizontal surface and a vertical surface, said assembly comprising:
   a vacuum chamber,
   rotatable means within said vacuum chamber and having a horizontal axis therethrough and adapted to rotatably support an object to be metallized,
   first evaporation means connected horizontally below the rotatable means within said vacuum chamber for thermally evaporating metal vertically toward the object to the horizontal surface thereof,
   and characterized by including second evaporation means connected vertically to the rotatable means within said vacuum chamber for thermally evaporating metal horizontally toward the object to the vertical surface thereof.

2. An assembly as set forth in claim 1 further characterized by said rotatable means comprising a rotatable carousel having a plurality of support reels along said diameter and parallel with said horizontal axis, and a plurality of hangers pivotally attached to said support bars for pivotally supporting the object suitable with said support reel maintaining the horizontal and vertical surfaces thereof horizontal and vertical, respectively to the axis.

3. An assembly as set forth in claim 2 wherein said second evaporation means comprises a bus bar extending vertically along one end of the carousel transverse to the horizontal axis for receiving and transmitting a voltage, and a tubular boat for containing metal and connected to said bus bar for evaporating metal in response to said voltage applied thereto in the horizontal direction toward the vertical surface of the object.

4. An assembly as set forth in claim 3 wherein said first evaporation means comprises a bus bar longitudinally extending below and parallel with the horizontal axis for receiving and transmitting a voltage, and a plurality of boats for containing the metal connected across said bus bar for evaporating the metal in response to metal supplied thereto.

5. A method of vacuum metallizing an object having a horizontal surface and a vertical surface, the method including the steps of:
   rotating the object in a vacuum chamber about a horizontal axis with the horizontal surfaces and the vertical surfaces of the object maintained with respect to the horizontal axis,
   vacuum metallizing the horizontal surface of the object by directing thermally evaporated metal in the vertical direction, and
   the method characterized by vacuum metallizing the object by separately directing thermally evaporated metal in a horizontal direction to metallize the vertical surfaces of the object.

* * * * *